(12) United States Patent
Kuroki

(10) Patent No.: US 8,129,088 B2
(45) Date of Patent: Mar. 6, 2012

(54) ELECTRODE AND METHOD FOR MANUFACTURING THE SAME

(75) Inventor: Masakatsu Kuroki, Kanagawa (JP)

(73) Assignee: E.I. du Pont de Nemours and Company, Wilmington, DE (US)

( * ) Notice: Subject to any disclaimer, the term of this patent is extended or adjusted under 35 U.S.C. 154(b) by 299 days.

(21) Appl. No.: 12/496,920

(22) Filed: Jul. 2, 2009

(65) Prior Publication Data

US 2011/0003246 A1 Jan. 6, 2011

(51) Int. Cl.
*G03F 7/00* (2006.01)
*G03F 7/004* (2006.01)
*G03F 7/028* (2006.01)
*G03F 7/26* (2006.01)
*G03F 7/40* (2006.01)

(52) U.S. Cl. ...... 430/270.1; 430/311; 430/320; 430/330; 430/331; 430/281.1; 430/905; 430/913

(58) Field of Classification Search ........ 430/270.1, 430/905, 311, 320, 330, 331, 913, 281.1, 430/198
See application file for complete search history.

(56) References Cited

U.S. PATENT DOCUMENTS

| | | | |
|---|---|---|---|
| 3,380,381 A | 4/1968 | Musgrave | |
| 4,070,517 A * | 1/1978 | Kazmierowicz | 428/209 |
| 4,122,232 A | 10/1978 | Kuo | |
| 5,047,313 A | 9/1991 | Nebe et al. | |
| 7,582,229 B2 * | 9/2009 | Lee et al. | 252/512 |
| 7,588,877 B2 * | 9/2009 | Shin et al. | 430/270.1 |
| 7,655,864 B2 * | 2/2010 | Sato et al. | 174/94 R |
| 7,776,507 B2 * | 8/2010 | Kusano et al. | 430/270.1 |
| 7,887,992 B2 * | 2/2011 | Ito et al. | 430/270.1 |
| 2005/0287472 A1 | 12/2005 | Lee et al. | |
| 2007/0001607 A1 | 1/2007 | Cho et al. | |
| 2010/0093248 A1 * | 4/2010 | Sato et al. | 445/52 |

FOREIGN PATENT DOCUMENTS

| | | |
|---|---|---|
| EP | 0863534 A2 | 9/1998 |
| EP | 1901331 A2 | 3/2008 |
| JP | 11242930 A * | 9/1999 |
| WO | 2008/008521 A2 | 1/2008 |

OTHER PUBLICATIONS

Machine translation of JP 11-242930 (no date).*
International Search Report Dated Aug. 25, 2010 for International Application No. PCT/US2010/040719.

* cited by examiner

*Primary Examiner* — Amanda C. Walke

(57) ABSTRACT

A low-resistance, fine electrode is formed by baking in air a photosensitive paste which has an inorganic component containing copper powder, boron powder, and glass frit, and an organic component containing a photopolymerization initiator, monomer, and organic vehicle, and in which the average particle size of the copper powder is 2.5 μm or less, and the content of boron powder based on the total amount of copper powder and boron powder is 8 to 25 wt %.

9 Claims, 2 Drawing Sheets

ELECTRODE AND METHOD FOR MANUFACTURING THE SAME

BACKGROUND OF THE INVENTION

1. Field of the Invention

The present invention relates to an electrode of an electric device, and more particularly to improvements in the conductive components included in the electrode.

2. Technical Background

Methods are widely known wherein a conductive paste is used as the raw material of an electrode. Micronization of electrode patterns has advanced together with the functional improvements in electronic devices, and photosensitive paste is used to form fine lines thereon. For example, a fine electrode pattern is used to improve the resolution of a plasma display panel (PDP).

The composition of the photosensitive paste generally includes a monomer in addition to a photopolymerization initiator, a conductive component, glass frit, organic binder, and solvent. The applied photosensitive paste is exposed through a mask, and polymerization of the monomer proceeds at the exposed locations. Thereafter, development and firing are carried out, and an electrode consisting of a conductive component and glass as a binder is formed thereby.

Silver is generally used as the conductive component (e.g., U.S. Pat. No. 5,047,313 and US Patent 20050287472). Capital investment for the furnace can be decreased because precious metals such as gold, silver, and palladium can be fired in air. Using precious metals, however, invites a sharp rise in material costs because precious metals are expensive.

Copper is widely used as a conductive component in semiconductor circuits and the like. Copper has the advantage of being less expensive than silver. However, copper cannot be fired in air because it oxidizes easily, and this increases capital investment because firing under a nitrogen atmosphere and the like is required.

A method using boron together with metal powder has been disclosed as technology that enables air firing of an easily oxidizable metal in a non-photosensitive paste (U.S. Pat. No. 4,122,232). In the examples of U.S. Pat. No. 4,122,232, copper powder finer than 325 mesh is used. The average particle size of the copper powder is not specifically described, but the average particle size of copper powder sorted using a 325 mesh is generally 40 to 50 $\mu$m.

Various technical obstacles have emerged, however, when this technology was applied to photosensitive paste. More specifically, boron scatters light, and there has been a problem because the exposed light is scattered when boron is added to the photosensitive paste, and the shape of the pattern is adversely affected thereby. Moreover, a small particle size is preferred in the conductive component to obtain an excellent fine line configuration, but when the particle size of the conductive component is small, the surface area thereof increases and as a result, oxidation proceeds more easily. It is preferable to increase the amount of added boron to inhibit the progress of oxidation, but if a large amount of boron is contained therein, the resistance of the electrode increases because boron has poor conductivity.

Thus, in the process of forming an electrode using a paste, the development of technology is needed that will satisfy the following requirements of: 1) enabling the use of inexpensive copper powder, 2) enabling firing to be performed in air, 3) enabling a fine pattern to be formed, and 4) enabling low electrode resistance.

SUMMARY OF THE INVENTION

The present invention provides a finely patterned electrode that contains copper powder as the conductive component thereof and that is formed by firing in air, and that has low resistance.

The problems mentioned in the Technical Background can be solved by controlling the content, particle size, and the like of the components, as detailed herein.

More specifically, the present invention is an electrode formed by firing in air a photosensitive paste which has inorganic component comprising copper powder, boron powder, and glass frit, and organic components comprising a photopolymerization initiator, monomer, and an organic vehicle, wherein the average particle size of the copper powder is 2.5 $\mu$m or less, and the content of boron powder, based on the total amount of copper powder and boron powder, is 8 to 25 wt %.

The present invention is also a method for manufacturing an electrode for a plasma display panel, comprising the steps of: applying a photosensitive paste which has an inorganic component containing copper powder, boron powder, and glass fit, and an organic component containing a photopolymerization initiator, monomer, and organic vehicle, and in which the average particle size of the copper powder is 2.5 $\mu$m or less, and the content of boron powder based on the total amount of copper powder and boron powder is 8 to 25 wt %; drying the applied photosensitive paste; exposing the dried photosensitive paste; developing the exposed photosensitive paste; and firing the developed photosensitive paste to form an electrode pattern.

The present invention enables the formation of a low-resistance, fine pattern by air firing using an inexpensive conductive component. The present invention will contribute to a decrease in the cost of producing an electrode for an electronic device.

DETAILED DESCRIPTION OF THE INVENTION

Figure 1A:
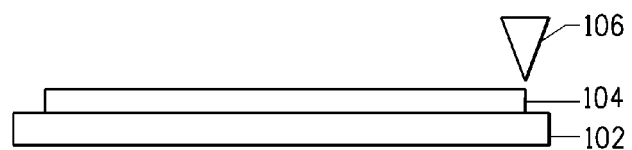
FIG. 1 is a schematic diagram illustrating the manufacturing process of the address electrodes using the photosensitive paste.
Figure 1B:
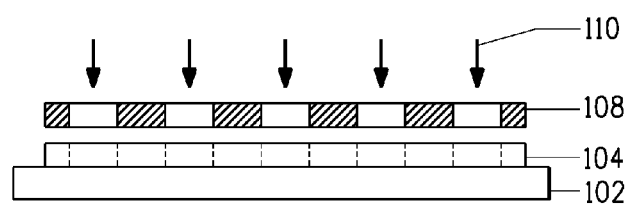
Figure 1C:
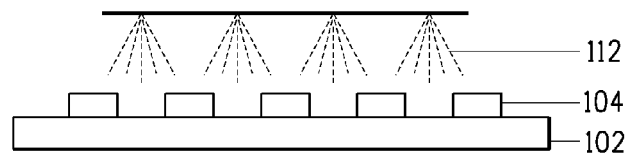
Figure 1D:
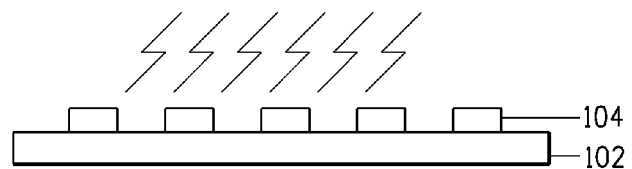
Figure 1E:
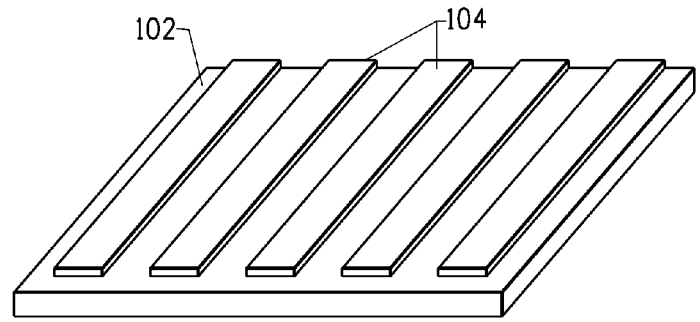

The present invention will be explained through the thereof for an address electrode of a plasma display panel (PDP) as an example. Using the present invention for a PDP address electrode is preferred, but the use of the present invention is not limited thereto.

A PDP address electrode is formed using a photosensitive paste. First, the composition of the photosensitive will be explained. To formulate the photosensitive paste, a vehicle of each element is formulated by using organic elements and solvent as may be necessary, which is then mixed with conductive powder and glass frit. After that, the obtained mixture is kneaded by using a sand mixer, such as a roll mixer, mixer, homogeneous mixer, ball mill and bead mill, thereby obtaining the photosensitive paste.

Inorganic Components

Copper powder, boron powder and glass frit are typical inorganic components.

(I) Copper Powder

Copper powder is added to provide conductivity. Its average diameter is less than 2.5 $\mu$m, preferably less than 2.0 $\mu$m, more preferably less than 1.5 $\mu$m. The lower limit of the diameter is not particularly restricted; however, from a viewpoint of material cost, copper powder with more than 0.1 µm of average diameter is preferable. The average diameter is obtained by measuring the distribution of the particle diameters by using a laser diffraction scattering method and can be defined as D50. Microtrac model X-100 is an example of the commercially-available devices.

An electrode with low resistance can be formed by using copper powder with a fine particle size. There has been a problem when a fine copper powder is used because oxidation proceeds when air firing is carried out and as a result, the resistance of the electrode increases. The electrode resistance is decreased in the present invention by the use of fine copper powder under conditions wherein a predetermined amount of boron is present.

The form of copper is not particularly limited. It can be in spherical or flake form. However, the spherical form is preferable in the photosensitive paste.

The content of copper powder is preferred to be 20 to 65 wt %, based on the total amount of the photosensitive paste.

A metal other than copper powder can be contained in the photosensitive paste, but from the standpoint of reducing the cost of raw materials, preferably a precious metal such as silver, gold, or palladium is not substantially contained therein. Herein the term "not substantially contained" is a concept that encompasses cases in which a precious metal is unintentionally contained as an impurity.

(II) Boron Powder

Boron powder is used to prevent oxidation of the copper during firing. The increase in electrode resistance resulting from copper oxidation can be inhibited by adding boron powder to the paste.

The average particle diameter is preferably less than 3 µm, and more preferably 2 µm. The average diameter is obtained by measuring the distribution of the particle diameters by using a laser diffraction scattering method and can be defined as D50. Microtrac model X-100 is an example of the commercially-available devices. The lower limit of the diameter is not particularly restricted, however, from a viewpoint of material cost, boron powder with more than 0.1 µm of average diameter is preferable.

The use of boron powder of a small particle size is effective when forming a thin electrode. When a thin electrode with a film thickness of 1 to 4 µm is formed, the use of boron powder with a large particle size causes deterioration in the appearance of film quality at the time of development. The electrode appearance can be excellently conserved by using boron powder with the small particle size stipulated above.

The content of boron powder based on the total amount of copper powder and boron powder is preferably 8 to 25 wt %, more preferably 9 to 22 wt %, even more preferably 10 to 19 wt %, and most preferably 14 to 18 wt %. If the boron content is too low, oxidation of the copper powder is not sufficiently inhibited and the resistance of the electrode increases. If the boron content is too high, resistance of the electrode increases because the content of the conductive component decreases. Furthermore, if the boron content is too high, the exposure efficiency drops, and the shape of the electrode becomes distorted.

The content of boron powder based on the total amount of the photosensitive paste is preferred to be 2 to 18 wt %.

(III) Glass Frit

Glass frit can increase the sealing property of the composition with a substrate, for example the glass substrate used for the rear panel of PDP.

Types of glass frit include bismuth-based glass frit, boric acid-based glass frit, phosphorus-based glass frit, Zn—B based glass frit, and lead-based glass frit. The use of lead-free glass frit is preferred in consideration of the burden imposed on the environment.

Glass frit can be prepared by methods well known in the art. For example, the glass component can be prepared by mixing and melting raw materials such as oxides, hydroxides, carbonates etc, making into a cullet by quenching, followed by mechanical pulverization (wet or dry milling). Thereafter, if needed, classification is carried out to the desired particle size.

The softening point of the glass frit is normally to be 325 to 700° C., preferably 350 to 650° C., and more preferably 550 to 600° C. If melting takes place at a temperature lower than 325° C., the organic substances will tend to become enveloped, and subsequent degradation of the organic substances will cause blisters to be produced in the paste. A softening point over 700° C., on the other hand, will weaken the paste adhesion and may damage the glass substrate.

The specific surface area of the glass frit is preferred to be no more than 10 $m^2/g$. The average diameter is generally 0.1-10 µm. At least 90 wt % of the glass frit is preferred to have a particle diameter of 0.4 to 10 µm.

The content of glass frit is preferred to be 0.1 to 5 wt %, based on the total amount of the photosensitive paste. A proportion of glass frit within this range will ensure bonding with the adjacent constituents, thereby ensuring the formation of sufficiently strong bus electrodes.

Organic Components

Photo polymerization initiator, monomer, organic vehicle are typical organic components. Usually, organic vehicle contains organic polymer binder and solvent.

(I) Photo Polymerization Initiator

Photo polymerization initiator is used for photo polymerize the photo polymerization-type monomer. The photo polymerization initiator is preferably thermally inactive at 185° C. or lower, but it generates a free radical when it is exposed to actinic rays.

Examples of the photo polymerization initiator include compounds having two intramolecular rings in the conjugated carbocyclic ring system. This type of compound contains substituted or non-substituted multinuclear quinone.

Practically, examples of quinone include: ethyl 4-dimethyl aminobenzoate, diethylthioxanthone, 9,10-anthraquinone, 2-methylanthraquinone, 2-ethylanthraquinone, 2-t-butylanthraquinone, octamethylanthraquinone, 1,4-naphtoquinone, 9,10-phenanthrenequinoen, benzo[a]anthracene-7,12 dione, 2,3-naphtacene-5,12-dione, 2-methyl-1,4-naphtoquinone, 1,4-dimethylanthraquinone, 2,3-dimethylanthraquinone, 2-phenylanthraquinone, 2,3-diphenylanthraquinone, retenequinone, 7,8,9,10-tetrahydronaphtacene-5,12-dione and 1,2,3,4-tetrahydrobenzo[a]anthracene-7,12-dione.

Other compounds that may be used include those given in U.S. Pat. Nos. 2,760,863, 2,850,445, 2,875,047, 3,074,974, 3,097,097, 3,145,104, 3,427,161, 3,479,185, 3,549,367, and 4,162,162.

The content of photo polymerization initiator is preferred to be 0.1 to 10 wt % based on the total amount of the photosensitive paste.

(II) Photo Polymerization Monomer

Photopolymerizable monomers are not particularly limited. Examples include ethylenic unsaturated compounds having at least one polymerizable ethylene group. Preferably, the photosensitive paste contains at least one multi-point crosslinking monomer with 3 or more linking groups.

Examples of the preferable monomer include: (metha) acrylic acid t-butyl, 1,5-pentandioldi(metha)acrylate, (metha)acrylic acid N,N-dimethylaminoethyl, ethyleneglycoldi (metha)acrylate, 1,4-butanedioldi(metha)acrylate, diethyleneglycoldi(metha)acrylate, hexamethyleneglycoldi (metha)acrylate, 1,3-propanedioldi(metha)acrylate, decamethyleneglycoldi(metha)acrylate, 1,4-cyclohexanedioldi (metha)acrylate, 2,2-dimethylolpropanedi(metha)acrylate, glyceroldi(metha)acrylate, tripropyleneglycoldi(metha) acrylate, glyceroltri(metha)acrylate, trimethylolpropanetri (metha)acrylate, trimethylolpropane ethoxytriacrylate, the compound disclosed in U.S. Pat. No. 3,380,381, 2,2-di(p-hydroxyphenyl)-propanedi(metha)acrylate, pentaetythritoltetra(metha)acrylate, dipentaerythritol Pentaacrylate, dipentaerythritol Tetraacrylate, triethyleneglycoldiacrylate, polyoxyetyl-1,2-di-(p-hydroxyetyl)propanedimethacrylate, bisphenolAdi-[3-(metha)acryloxy-2-hydroxypropyl]ether, bisphenolAdi-[2-(metha)acryloxyetyl]ether, 1,4-butanedioldi-(3-methacryloxy-2-hydroxypropyl)ether, triethyleneglycoldimethacrylate, polyoxypropyltrimethylolpropanetriacrylate, butyleneglycoldi(metha)acrylate, 1,2,4-butanedioltri(metha)acrylate, 2,2,4-trimethyl-1,3-pentandioldi(metha)acrylate, 1-phenylethylene-1,2-dimethacrylate, fumaric diallyl, styrene, 1,4-benzenedioldimethacrylate, 1,4-diisopropenylbenzene and 1,3,5-triisopropenylbenzene. Here, (metha)acrylate represents both acrylate and methacrylate.

Preferably, the monomer content is 8 to 35 wt % in relation to the total amount of the inorganic component. If the monomer content is too low, the exposure efficiency drops, and the width of the electrode becomes too narrow. In some cases, wire disconnections and shorts occur in the electrode due to poor exposure. On the other hand, if the monomer content is too high, the electrode resistance increases and surface stickiness increases.

The content of photo polymerization monomer is preferred to be 1 to 24 wt % based on the total amount of the photosensitive paste.

(III) Organic Polymer Binder

An organic binder is used to allow constituents such as the conductive powder, boron powder and glass frit to be dispersed in the composition. The organic polymer binder is used for improving the coating property and stabilization of the coating film when the conductive paste is coated on a substrate in a screen printing or concerning technology by using a known method. The organic polymer binder is removed when the electrodes are formed by sintering the photosensitive paste.

When the coated and dried photosensitive paste is developed with an aqueous developing fluid and its patterns are formed, it is preferable to use the organic polymer binder which has high resolution considering the developmental ability with the aqueous developing fluid. Examples of the organic polymer binder which can meet this condition include those that contain non-acidic comonomer or acidic comonomer. Copolymer or interpolymer (mixed polymer) are also preferable. Other examples of organic polymer binder are acrylic polymer binder or other polymer binders shown in US Patent Publication No. 2007-0001607.

The content of organic polymer binder is preferred to be 2 to 30 wt % based on the total amount of the photosensitive paste.

(IV) Solvent

The primary purpose for using an organic solvent is to allow the dispersion of solids contained in the composition to be readily applied to the substrate. As such, the organic solvent is preferred to first of all be one that allows the solids to be dispersed while maintaining suitable stability. Secondly, the rheological properties of the organic solvent is preferred to endow the dispersion with favorable application properties.

The organic solvent may be a single component or a mixture of organic solvents. The organic solvent that is selected is preferred to be one in which the polymer and other organic components can be completely dissolved. The organic solvent that is selected is preferred to be inert to the other ingredients in the composition. The organic solvent is preferred to have sufficiently high volatility, and is preferred to be able to evaporate off from the dispersion even when applied at a relatively low temperature in the atmosphere. The solvent is preferred not to be so volatile that the paste on the screen will rapidly dry at ordinary temperature during the printing process.

The boiling point of the organic solvent at ordinary pressure is preferred to be no more than 300° C., and preferably no more than 250° C.

Specific examples of organic solvents include aliphatic alcohols and esters of those alcohols such as acetate esters or propionate esters; terpenes such as turpentine, α- or β-terpineol, or mixtures thereof; ethylene glycol or esters of ethylene glycol such as ethylene glycol monobutyl ether or butyl cellosolve acetate; butyl carbitol or esters of carbitol such as butyl carbitol acetate and carbitol acetate; and Texanol (2,2, 4-trimethyl-1,3-pentanediol monoisobutyrate).

The content of solvent is preferred to be 3 to 50 wt % based on the total amount of the photosensitive paste.

(V) Additional Elements

Additional elements known to those skilled in the art such as dispersing agent, stabilizer such as TAOBN (1,4,4-trimethyl-2,3-diazabicyclo[3.2.2]-non-2-ene-N,N-dioxide) and malonic acid, plasticizer, parting agent, stripping agent, antifoaming agent such as silicone oil and moistening agent can be present in the photosensitive paste. Appropriate elements may be selected based on the conventional technologies.

As noted above, the photosensitive paste has an inorganic component and an organic component, and when the total amount of the inorganic component excluding the solvent is designated as the "organic component weight" and the total amount of the inorganic component is designated as the "inorganic component weight," the ratio of [inorganic component weight]/[organic component weight] is preferably 1.2 to 3.5. If the amount of the organic component is too small, the exposure efficiency decreases, and pattern formation becomes extremely difficult. If the amount of the organic component is too large, sintering of the copper powder is delayed, oxidation of the copper powder proceeds and as a result, the electrode resistance increases.

Method of Manufacturing an Electrode

The method for manufacturing an electrode using the photosensitive paste will be explained with reference to the drawings.

The electrodes of the present invention can be used as the address electrodes of a rear substrate for the PDP. The electrodes of the present invention has film thickness, form and pitch which are appropriate as the address electrodes for the PDP.

FIG. 1 is a schematic diagram illustrating practical manufacturing procedures. First, the photosensitive paste is coated on a glass substrate. Conductive photosensitive paste (104) is fully coated on glass substrate (102) by screen-printing and coating method (106) which uses a dispenser (FIG. 1(A)).

Next, the coated photosensitive paste is dried. The drying condition is not particularly limited if the layer of the photosensitive paste is dried. For example, it may be dried for 18-20 minutes at 100° C. Also, the photosensitive paste can be dried by using a conveyer-type infrared drying machine.

Next, the dried photosensitive paste is patterned. In the patterning treatment, the dried photosensitive paste is exposed and developed. In the exposing process, photo mask (108) which has electrode patterns is placed on dried photosensitive paste (104) to which ultraviolet rays (110) are irradiated (FIG. 3(B)).

The exposing condition differs depending on the type of the photosensitive paste and the film thickness of the photosensitive paste. For example, in an exposing process where a gap of 200-400 µm is used, it is preferable to use ultraviolet ray of 100 mJ/cm$^2$ to 2000 mJ/cm$^2$. The irradiating period is preferably 5-200 seconds.

The development can be made by alkaline solution. As the alkaline solution, 0.4% sodium carbonate solution may be used. The development can be made by spraying alkaline solution (112) to exposed photosensitive paste layer (104) on substrate (102) (FIG. 3(C)) or immersing substrate (102) which has exposed photosensitive paste (104) into the alkaline solution.

Next, the patterned photosensitive paste is sintered (FIG. 3(D)). The composition can be sintered in a sintering furnace which has a predetermined temperature profile. The maximum temperature during the sintering process is preferably 400-600° C., or more preferably 500-600° C. The sintering period is preferably 1-3 hours, or more preferably 1.5 hours.

In the present invention firing is carried out in an air atmosphere. As noted above, a low-resistance, fine pattern can be formed even with air firing by controlling the composition of the photosensitive paste. In the present application, "firing in air" or "air firing" essentially refers to firing without replacing the atmosphere in the firing furnace, and more specifically it includes both firing without replacing the atmosphere in the firing furnace and firing with a replacement of 5 vol % or less of the atmosphere in the furnace.

After the sintering and cooling processes, substrate (103) with address electrodes (114) are obtained (FIG. 3(E)).

For use as a wiring material in the same manner as silver paste, the volume resistivity cannot be exceeded by a large amount compared to that of silver (for example, 100 times). If the volume resistivity becomes too large, substitution with copper becomes very difficult because a drastic design change is required. The volume resistivity of silver is $1.6 \times 10^{-6}$ Ω·cm near room temperature, so when a criterion of 100 times is established, it is preferable for the volume resistivity to be $1.6 \times 10^{-4}$ Ω·cm or less. In accordance with the present invention it is possible to form such a low-resistance electrode by using copper as the conductive component even if air baking is carried out.

The present invention is applicable to electronic devices that have an electrode, but the use is not particularly limited thereto. Preferably, the present invention is applicable to an electrode of the rear panel of a PDP. The production cost of a PDP can be reduced by using the present invention.

Examples

The invention is illustrated in further detail below by examples. The examples are for illustrative purposes only, and are not intended to limit the invention.

(A) Test on the Effect of Copper and Boron Powder Ratio

1. Preparation of Organic Components

Texanol (2,2,4-trimethyl-1,3-pentanediol monoisobutyrate) as the solvent and acrylic polymer binder having a molecular weight of 6,000 to 7,000 as the organic binder were mixed, and the mixture was heated to 100° C. while stirred. The mixture was heated and stirred until all of the organic binder had dissolved. The resulting solution was cooled to 75° C. EDAB (ethyl 4-dimethyl aminobenzoate), DETX (diethylthioxanthone), and Irgacure 907 by Chiba Specialty Chemicals were added as photo polymerization initiator, and TAOBN (1,4,4-trimethyl-2,3-diazabicyclo[3.2.2]-non-2-ene-N,N-dixoide) was added as a stabilizer. The mixture was stirred at 75° C. until all the solids had dissolved. The solution was filtered through a 40 micron filter and cooled.

2. Preparation of Copper and Boron Paste

A photopolymerization monomer consisting of 2.42 wt % TMPEOTA (trimethylolpropane ethoxytriacrylate), 2.42 wt % Laromer® LR8967 (polyethyl acrylate oligomer) by BASF and 7.26 wt % Sartomer® SE399 (dipentaerythritol pentaacrylate), 0.26 wt % malonic acid as a stabilizer, 0.04 wt % silicone antifoamer (BYK Chemie, BYK085), were mixed with 20.31 wt % of the above organic component in a mixing tank under yellow light, so as to prepare a paste. 1.09 wt % bismuth fit (Nippon Yamamura Glass), boron powder (H. C. Starck, Boron Amorphous I, D50=0.9 µm), and copper powder (Ultrafine Powder Technology, D50=1.0 µm) was used as the conductive particles. The amounts of boron powder and copper powder varied between the different examples and comparative examples as shown in Table 1. The amounts used in the examples and comparative examples are given in Tables 1 to 3.

The entire paste was mixed until the particles of the inorganic material were wet with the organic material. The mixture was dispersed using a 3-roll mill.

3. Preparation of Electrodes

Precautions were taken to avoid dirt contamination, as contamination by dirt during the preparation of the paste and the manufacture of the parts would have resulted in defects.

3-1: Coating

The copper and boron paste was applied to a glass substrate by screen printing using a 200 to 400 mesh screen. Suitable screen and viscosity of the black electrode paste was selected, to ensure the desired film thickness was obtained. The paste was then dried for 20 minutes at 100° C. in a hot air circulating furnace, so as to form copper and boron electrodes having a dried film thickness of 4.5 to 5.0 µm.

3-2: UV Ray Pattern Exposure

The dried paste was exposed to light through a photo tool using a collimated UV radiation source (illumination: 18 to 20 mW/cm$^2$; exposure: 200-2000 mJ/cm$^2$).

3-3: Development

An exposed sample was placed on a conveyor and then placed in a spray developing device filled with 0.4 wt % sodium carbonate aqueous solution as the developer. The developer was kept at a temperature of 30° C., and was sprayed at 10 to 20 psi.

The developing time was decided in the following manner. First the time for an unexposed dry film to be washed in the developer (TTC, Time To Clear) was measured by printing under the same conditions as for a sample with an exposed pattern and using that dried unexposed sample. Next, a sample part with an exposed pattern was developed with the developing time set to 1.5 times TTC.

The developed sample was dried by blowing off the excess water with an air jet.

3-4: Sintering

A peak temperature of 590° C. was reached (first sintering) by sintering in a belt furnace in air using a 1.5 hour profile.

The content of the organic component and various sizes of copper powder were held constant, the ratio of the weight of boron to the weight of copper and boron combined ([B]/[Cu+B]) was varied from 5% to 50%, and the surface resistance of fired parts was measured.

For a measurement of surface resistance, a test piece was prepared by screen printing the sample paste on a glass slide to form 40 mm×40 mm square printed area with poly #380 mesh screen. The parts were dried, totally exposed without using a photomask, then fired. Surface resistance of the fired film was measured by applying two probes on the surface across the diagonal line of 40 mm×40 mm area. For this measurement, the thickness of fired film was adjusted to a range of 3 to 5 µm.

Line formation was evaluated by the following method. Developed sample pieces with pattern exposure were visually checked to determine whether or not fine lines remained after development. More specifically, sample parts were exposed at 800 mJ/cm$^2$ with 100 µm line pattern photomask, then developed with developing time of 1.5 times of TTC, while thickness of fired film was adjusted 3 to 5 µm.

It was scored as OK when 100 µm lines remained after develop. But if 100 µm lines had been washed away or many broken wires were observed, it was scored NG (no good).

Figure 2:
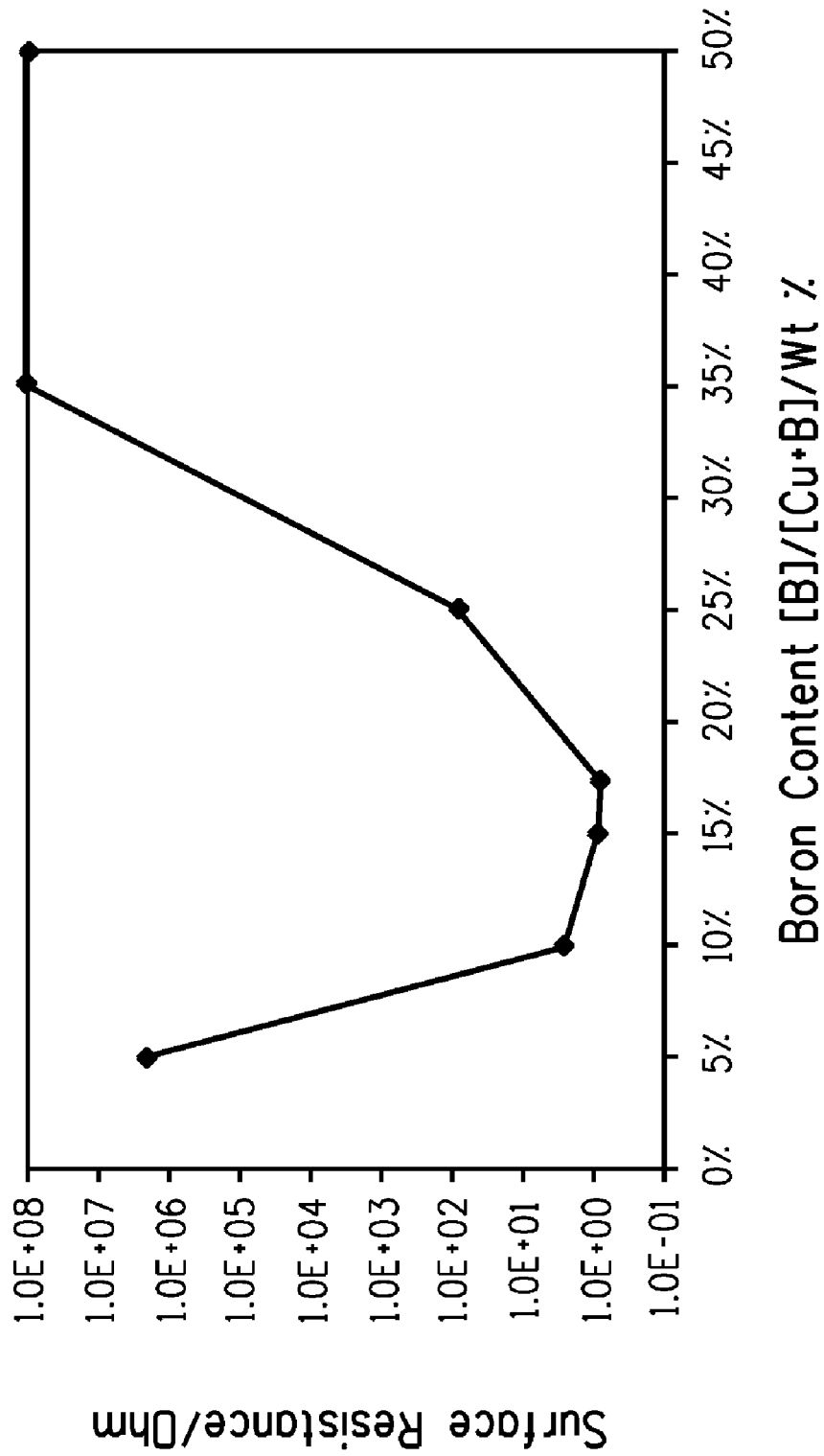
FIG. 2 is a graph showing the relation between boron content and surface resistance.

Under air firing conditions copper powder is easily oxidized, but in samples with a boron weight ratio of 15% and 17.5% the surface resistance was less than 1.0Ω, and it was found that oxidation was effectively inhibited by the presence of boron. In the sample with a boron content of 5 wt %, the resistance exceeded 1 MΩ because oxidation proceeded, and the surface resistance became very large. On the other hand, in samples with a boron content of 35 wt % and 50 wt % the surface resistance was greater than the upper measurement limit of the device (100 mΩ). When the permissible resistance value is set at 100Ω, a value of 5 wt % can be considered too small and a value of 35 wt % can be considered too large for the ratio of the weight of boron to the combined weight of copper and boron. FIG. 2 is a graph showing the relation between boron content and surface resistance.

TABLE 1

|  | Comparative Ex. 1 | Ex. 1 | Ex. 2 | Ex. 3 | Ex. 4 | Comparative Ex. 2 | Comparative Ex. 3 |
| --- | --- | --- | --- | --- | --- | --- | --- |
| Medium (binder, initiator, solvent) | 20.31 | 20.31 | 20.31 | 20.31 | 20.31 | 20.31 | 20.31 |
| Antifoamer (silicone oil) | 0.04 | 0.04 | 0.04 | 0.04 | 0.04 | 0.04 | 0.04 |
| Malonic acid (viscosity stabilizer) | 0.26 | 0.26 | 0.26 | 0.26 | 0.26 | 0.26 | 0.26 |
| Solvent (Texanol) | 5.96 | 5.96 | 5.96 | 5.96 | 5.96 | 5.96 | 5.96 |
| Monomer (TMPEOTA:Laromer ® LR8967: Sartomer ® SR399 = 1:1:3) | 12.09 | 12.09 | 12.09 | 12.09 | 12.09 | 12.09 | 12.09 |
| Glass frit (Nippon Yamamura Glass) | 1.09 | 1.09 | 1.09 | 1.09 | 1.09 | 1.09 | 1.09 |
| Boron (H. C. Starck) | 3.01 | 6.02 | 9.04 | 10.54 | 15.07 | 21.08 | 30.12 |
| Copper (Ultrafine Powder Technology, D50 = 1.0 µm) | 57.23 | 54.22 | 51.21 | 49.71 | 45.19 | 39.16 | 30.12 |
| Total | 100 | 100 | 100 | 100 | 100 | 100 | 100 |
| [Boron]/[Boron + Copper] | 5.0% | 10.0% | 15.0% | 17.5% | 25.0% | 35.0% | 50.0% |
| Surface resistance in Ohm | 1.78E06 | 2.832 | 0.822 | 0.774 | 78.13 | >10E08 | >10E08 |
| Photo patterning (100 um line after 800 mJ exposure, TTCx1.5 development) | OK | OK | OK | OK | OK | NG | NG |

(B) Test on the Effect of Diameter of Copper Powder

As shown in Table 2, the content of the organic component and the weight of boron to the combined weight of copper and boron ([B]/[Cu+B]=17.5 wt %) were held constant, the average particle size (D50) of the copper powder was varied, and the surface resistance was measured in fired parts. It was found that when copper powder with an average particle size (D50) of 3 µm was used, the surface resistance increased to 34.1Ω, and it was difficult to obtain the desired low resistance value with copper powder of such a large particle size.

TABLE 2

|  | Ex. 3 | Comp. Ex. 1 | Ex. 4 | Ex. 5 | Ex. 6 |
| --- | --- | --- | --- | --- | --- |
| Medium (binder, initiator, solvent) | 20.31 | 20.31 | 20.31 | 20.31 | 20.31 |
| Antifoamer (silicone oil) | 0.04 | 0.04 | 0.04 | 0.04 | 0.04 |
| Malonic acid (viscosity stabilizer) | 0.26 | 0.26 | 0.26 | 0.26 | 0.26 |
| Solvent (Texanol) | 6 | 5.96 | 5.96 | 5.96 | 5.96 |
| Monomer (TMPEOTA:Laromer ® LR8967:Sartomer ® SR399 = 1:1:3) | 12.09 | 12.09 | 12.09 | 12.09 | 12.09 |
| Glass frit (Nippon Yamamura Glass) | 1.09 | 1.09 | 1.09 | 1.09 | 1.09 |
| Boron (H. C. Starck) | 10.54 | 10.54 | 10.54 | 10.54 | 10.54 |
| Copper (Ultrafine Powder Technology, D50 = 1.0 µm) | 49.71 |  |  |  |  |
| Copper (Ultrafine Powder Technology, D50 = 3.0 µm) |  | 49.71 |  |  |  |
| Copper (Dowa Electronics, KCL-10, D50 = 1.3 µm) |  |  | 49.71 |  |  |
| Copper (Dowa Electronics, KCL-33, D50 = 0.8 µm) |  |  |  | 49.71 |  |
| Copper (Dowa Electronics, KCL-35, D50 = 1.1 µm) |  |  |  |  | 49.71 |
| Total | 100 | 100 | 100 | 100 | 100 |
| [Boron]/[Boron + Copper] | 17.5% | 17.5% | 17.5% | 17.5% | 17.5% |
| Copper D50 value in µm | 1.0 | 3.0 | 1.3 | 0.8 | 1.1 |
| Surface resistance in Ohm | 0.774 | 34.110 | 0.435 | 0.413 | 0.420 |
| Photo patterning (100 um line after 800 mJ exposure, TTCx1.5 development) | OK | OK | OK | OK | OK |

(C) Test on the Effect of Organic and Inorganic Composition.

The weight of boron to the combined weight of copper and boron ([B]/[Cu+B] was held constant at 17.5 wt %, and using D50=1.1 copper powder, the pastes shown in Table 3 were prepared by varying the amounts of inorganic component and organic component or the amount of monomer in the organic component, and the volume resistivity after baking was determined in relation to photo-patterning and patterned lines.

Overall a good value was obtained for surface resistance measured without forming the lines. When the details of the inorganic/organic composition were investigated, the pattern formation of 100 μm lines tended to be good when the value of the [weight of inorganic component]/[weight of organic component] was 3.5 or less. The line formation also tended to be good when the [weight of monomer]/[weight of inorganic component] ranged from 0.1 to 0.3. As shown in Table 3, the resistivity increased when the [weight of inorganic component]/[weight of organic component] became smaller. The lines could be formed well when the [weight of monomer]/[weight of organic component] rose to 0.3 or higher, but the resistance increased, and surface stickiness tended to increase.

Volume resistivity was evaluated by the following method.

For volume resistivity, the resistance was measured on a pattern that was formed by exposing using a photomask having a pattern of lines 400 μm wide and 14.7 mm long, developing, and firing. Then the volume resistivity was calculated from the line width and film thickness.

TABLE 3

Ex. 7-Ex. 15

| | Ex. 7 | Ex. 8 | Ex. 9 | Ex. 10 | Ex. 11 | Ex. 12 | Ex. 13 | Ex. 14 | Ex. 15 |
|---|---|---|---|---|---|---|---|---|---|
| Medium (binder, initiator, solvent) | 18.99 | 17.36 | 16.43 | 21.80 | 20.31 | 20.03 | 19.00 | 24.33 | 22.44 |
| Antifoamer (silicone oil) | 0.04 | 0.04 | 0.04 | 0.05 | 0.04 | 0.04 | 0.04 | 0.05 | 0.05 |
| Malonic acid (viscosity stabilizer) | 0.24 | 0.22 | 0.21 | 0.28 | 0.26 | 0.26 | 0.24 | 0.31 | 0.29 |
| Solvent (Texanol) | 5.88 | 5.79 | 5.73 | 6.05 | 5.96 | 5.94 | 5.88 | 6.20 | 6.09 |
| Monomer (TMPEOTA:Laromer ® LR8967:Sartomer ® SR399 = 1:1:3) | 5.20 | 12.90 | 17.34 | 5.97 | 12.10 | 13.22 | 17.44 | 6.66 | 13.51 |
| Glass frit (Nippon Yamamura Glass) | 1.23 | 1.13 | 1.07 | 1.17 | 1.09 | 1.07 | 1.02 | 1.11 | 1.02 |
| Boron (H. C. Starck) | 11.97 | 10.95 | 10.36 | 11.32 | 10.54 | 10.40 | 9.87 | 10.74 | 9.91 |
| Copper (Dowa Electronics, KCL-35, D50 = 1.1 μm) | 56.44 | 51.61 | 48.83 | 53.37 | 49.71 | 49.03 | 46.51 | 50.61 | 46.70 |
| [Boron]/[Boron + Copper] | 17.5% | 17.5% | 17.5% | 17.5% | 17.5% | 17.5% | 17.5% | 17.5% | 17.5% |
| Copper D50 value in μm | 1.1 | 1.1 | 1.1 | 1.1 | 1.1 | 1.1 | 1.1 | 1.1 | 1.1 |
| [Amount of Monomer]/[Amount of Inorganic Component], wt. ratio | 0.07 | 0.20 | 0.29 | 0.09 | 0.20 | 0.22 | 0.30 | 0.11 | 0.23 |
| [Amount of Inorganic Component]/[Amount of Organic Component], wt. ratio | 4.61 | 2.90 | 2.33 | 3.80 | 2.70 | 2.56 | 2.10 | 3.23 | 2.29 |
| Surface resistance in Ohm | 0.555 | 0.44 | 0.502 | 0.562 | 0.515 | 0.576 | 0.66 | 0.581 | 0.594 |
| Photo patterning (100 um line after 800 mJ exposure, TTCx1.5 development) | NG | OK | OK | NG | OK | OK | OK | OK | OK |
| Volume resistivity at 400 um pattern in Ohm · cm | N/M | N/M | 4.28E+05 | N/M | 3.87E−05 | 4.14E−05 | 5.62E−05 | 5.16E−05 | 4.56E−05 |

Ex. 16-Ex. 23

| | Ex. 16 | Ex. 17 | Ex. 18 | Ex. 19 | Ex. 20 | Ex. 21 | Ex. 22 | Ex. 23 |
|---|---|---|---|---|---|---|---|---|
| Medium (binder, initiator, solvent) | 31.13 | 29.85 | 28.60 | 37.30 | 41.94 | 27.58 | 34.93 | 38.68 |
| Antifoamer (silicone oil) | 0.07 | 0.06 | 0.03 | 0.03 | 0.03 | 0.03 | 0.03 | 0.02 |
| Malonic acid (viscosity stabilizer) | 0.40 | 0.38 | 0.20 | 0.17 | 0.16 | 0.19 | 0.16 | 0.15 |
| Solvent (Texanol) | 6.60 | 6.52 | 5.69 | 5.57 | 5.50 | 5.65 | 5.52 | 5.44 |
| Monomer (TMPEOTA:Laromer ® LR8967:Sartomer ® SR399 = 1:1:3) | 8.52 | 12.09 | 4.29 | 3.73 | 3.43 | 7.54 | 9.54 | 10.57 |
| Glass frit (Nippon Yamamura Glass) | 0.94 | 0.91 | 1.08 | 0.94 | 0.87 | 1.05 | 0.88 | 0.80 |
| Boron (H. C. Starck) | 9.16 | 8.78 | 10.52 | 9.15 | 8.41 | 10.14 | 8.56 | 7.76 |
| Copper (Dowa Electronics, KCL-35, D50 = 1.1 μm) | 43.18 | 41.40 | 49.58 | 43.11 | 39.66 | 47.81 | 40.37 | 36.58 |
| [Boron]/[Boron + Copper] | 17.5% | 17.5% | 17.5% | 17.5% | 17.5% | 17.5% | 17.5% | 17.5% |
| Copper D50 value in um | 1.1 | 1.1 | 1.1 | 1.1 | 1.1 | 1.1 | 1.1 | 1.1 |
| [Amount of Monomer]/[Amount of Inorganic Component], wt. ratio | 0.16 | 0.24 | 0.07 | 0.07 | 0.07 | 0.13 | 0.19 | 0.23 |
| [Amount of Inorganic Component]/[Amount of Organic Component], wt. ratio | 2.15 | 1.85 | 3.22 | 2.33 | 1.97 | 2.72 | 1.82 | 1.49 |
| Surface resistance in Ohm | 0.607 | 1.047 | 0.373 | 0.484 | 0.643 | 0.412 | 0.615 | 1.053 |
| Photo patterning (100 um line after 800 mJ exposure, TTCx1.5 development) | OK | OK | NG | NG | NG | OK | OK | OK |
| Volume resistivity at 400 um pattern in Ohm · cm | 5.59E−05 | N/M | N/M | N/M | N/M | 3.93E−05 | 5.71E−05 | 1.05E−04 |

N/M: Not Measurable

What is claimed is:

1. An electrode formed by firing in air a photosensitive paste, said paste comprising an inorganic component containing copper powder, boron powder, and glass frit, and an organic component containing a photopolymerization initiator, monomer, and organic vehicle, and in which the average particle size of the copper powder is 2.5 μm or less, and the content of the boron powder based on the total amount of the copper powder and the boron powder is 8 to 25 wt %.

2. The electrode according to claim 1, wherein the average particle size of the boron powder is 3 μm or less, and the film thickness of the electrode is 1 to 4 μm.

3. The electrode according to claim 1, wherein the volume resistivity is $1.6 \times 10^{-4}$ Ω·cm.

4. A method for manufacturing an electrode for a plasma display panel, comprising the steps of:

applying a photosensitive paste comprising an inorganic component containing copper powder, boron powder, and glass frit, and an organic component containing a photopolymerization initiator, monomer, and organic vehicle, and in which the average particle size of the copper powder is 2.5 μm or less, and the content of the boron powder based on the total amount of the copper powder and the boron powder is 8 to 25 wt %;

drying the applied photosensitive paste;

exposing the dried photosensitive paste;

developing the exposed photosensitive paste; and firing the developed photosensitive paste in air to form an electrode pattern.

5. The method for manufacturing an electrode according to claim 4, wherein the average particle size of the boron powder is 3 μm or less, and the film thickness of the electrode is 1 to 4 μm.

6. The method for manufacturing an electrode according to claim 4, wherein the content of the monomer in relation to the content of the inorganic component is 8 to 35 wt %.

7. The method for manufacturing an electrode according to claim 4, wherein the ratio [weight of inorganic component]/[weight of organic component] in the photosensitive paste, where the weight of the inorganic component refers to the total weight of the inorganic component, and the weight of the organic component refers to the total weight of the organic component excluding a solvent, is 1.2 to 3.5, and the ratio [weight of monomer]/[weight of inorganic component] is 0.1 to 0.3.

8. The electrode according to claim 1, wherein the boron powder consists of boron element.

9. The method for manufacturing an electrode according to claim 4, wherein the boron powder consists of boron element.

* * * * *